(12) United States Patent
Lee et al.

(10) Patent No.: US 11,268,980 B1
(45) Date of Patent: Mar. 8, 2022

(54) METHOD AND SYSTEM FOR DETECTING STUCK COMPONENTS IN AUTOMATED TEST SYSTEMS

(71) Applicant: Invantest, Inc., San Jose, CA (US)

(72) Inventors: Wen Jau Lee, Penang (MY); Jason Saw, Singapore (SG)

(73) Assignee: Invantest, Inc., San Jose, CA (US)

( * ) Notice: Subject to any disclaimer, the term of this patent is extended or adjusted under 35 U.S.C. 154(b) by 0 days.

(21) Appl. No.: 17/325,700

(22) Filed: May 20, 2021

(51) Int. Cl.
 *G01R 1/04* (2006.01)
 *G01R 31/28* (2006.01)
 *G08B 5/22* (2006.01)

(52) U.S. Cl.
 CPC ....... *G01R 1/0466* (2013.01); *G01R 31/2834* (2013.01); *G08B 5/22* (2013.01)

(58) Field of Classification Search
 None
 See application file for complete search history.

(56) References Cited

U.S. PATENT DOCUMENTS

| | | | | |
|---|---|---|---|---|
| 7,619,432 B2 * | 11/2009 | Roberts | ............ | G01R 31/2893 324/750.3 |
| 9,285,393 B2 * | 3/2016 | Kikuchi | ............ | G01R 31/2874 |
| 9,316,686 B2 * | 4/2016 | Horino | ............... | G01R 31/2893 |
| 2002/0056057 A1 * | 5/2002 | Co | ........ | G11C 29/028 714/42 |
| 2010/0218050 A1 * | 8/2010 | Co | .......... | G11C 29/56016 714/42 |
| 2011/0000829 A1 * | 1/2011 | Linde | ............... | G01R 31/31718 209/571 |

\* cited by examiner

*Primary Examiner* — Jermele M Hollington
(74) *Attorney, Agent, or Firm* — Erise IP, P.A.

(57) ABSTRACT

An inference engine determines whether a device under test has become stuck in a test socket of an automated test system by analyzing measurement data sampled during normal execution of a production test program for the device. The inference engine is trained to identify stuck patterns in the measurement data for a particular device design. In the event a stuck condition is detected by the inference engine, testing by the automated test system is halted and an alert is transmitted to an operator.

19 Claims, 5 Drawing Sheets

(AMENDED)

| | 284(1) | 284(2) | 284(3) | 284(4) | 284(5) | 284(6) | |
|---|---|---|---|---|---|---|---|
| 1 | 1.79795 | 3.286871 | 1.798012 | 3.287023 | -0.32638 | -0.28346 | ... |
| 2 | 1.798143 | 3.312082 | 1.798272 | 3.312207 | -0.33763 | -0.28463 | |
| 3 | 1.824841 | 3.316363 | 1.80642 | 3.316537 | -0.2746 | -0.25001 | |
| 4 | 1.813682 | 3.312567 | 1.795527 | 3.312605 | -0.38064 | -0.2988 | |
| 5 | 1.815337 | 3.298713 | 1.796937 | 3.298594 | -0.32412 | -0.27338 | |
| 6 | 1.807709 | 3.296715 | 1.807556 | 3.296432 | -0.31365 | -0.28357 | |
| 7 | 1.793093 | 3.300961 | 1.793226 | 3.301037 | -0.34811 | -0.31309 | |
| 8 | 1.819703 | 3.300442 | 1.801281 | 3.300509 | -0.27275 | -0.23528 | ... |
| 9 | 1.821265 | 3.344518 | 1.802586 | 3.310915 | -0.31985 | -0.29483 | ... |
| 10 | 1.81069 | 3.296963 | 1.792472 | 3.297058 | -0.27794 | -0.24624 | ... |

METHOD AND SYSTEM FOR DETECTING STUCK COMPONENTS IN AUTOMATED TEST SYSTEMS

FIELD OF ART

The present disclosure relates generally to automated component testing, and more particularly to detecting stuck components in automated test systems.

BACKGROUND

Newly fabricated electronic components are typically subjected to a set of electrical tests to ensure proper operation. Components that pass the tests are binned and packaged for assembly into finished goods, while components that fail a test are separately binned and may be discarded. In high-volume production environments, automated test systems perform the set of electrical tests on an input stream of untested components and produce an output stream of passing components and a separate output stream of failing components. Each component is positioned into a test socket by a handler system and subjected to the set of electrical tests. In certain scenarios, a component becomes stuck in the test socket and the same component is tested repeatedly, while untested components that should have been seated in the test socket may be binned according to the stuck component test results. Some automated test systems perform the electrical tests on multiple components simultaneously and the handler positions the multiple components into multiple corresponding sockets, compounding the potential for stuck components. In general, high-volume automated test systems are not built to detect whether a component is stuck in a test socket. Furthermore, the problem of stuck components is becoming more acute as chip-scale packages (CSPs), integrated fan-out (InFO) packages, and other forms of extremely thin device packaging become increasingly popular. Thus, there is a need for addressing these and/or other issues associated with the prior art.

SUMMARY

A method is disclosed for detecting whether a device under test (DUT) is stuck in a test socket. The method comprises causing a handler system to pick a DUT from an input queue, causing the handler system to place the DUT in a test socket, applying stimulus signals to the DUT according to a test program for the DUT, and recording DUT parameters associated with the DUT responding to the stimulus signals. The method further comprises generating, by an inference engine, a test socket status of either stuck or normal by classifying the DUT parameters. Upon determining that the test socket status is stuck, an alert signal is generated. In an embodiment, at least one DUT parameter comprises a digital representation of an electrical signal generated by the DUT.

Upon determining that the test socket status is normal, the method may further comprise causing the handler system to dispose the DUT according to a test program result. In an embodiment, the test program result is passing and the handler system disposes the DUT in a pass bin.

In an embodiment, the electrical signal is an analog voltage or an analog current. In an embodiment, the DUT comprises an integrated circuit die packaged within a chip scale package or at least one integrated circuit packaged within an integrated fan-out package. In an embodiment, the inference engine comprises a decision tree including nodes and functions associated with the nodes, the DUT parameters comprising inputs to the functions, and the test socket status is determined by traversing the tree to reach an assessment. In an embodiment, the decision tree comprises a gradient boosted decision tree. In another embodiment, the inference engine comprises a neural network including input nodes, hidden nodes, and at least one output node, and wherein the DUT parameters are inputs to the input nodes, and the test socket status is generated as a function of the at least one output node.

In yet another embodiment, the inference engine comprises an ensemble of two or more different classification subsystems and the test socket status is generated by combining outputs from the two or more different classification subsystems. In certain embodiments, one of the two or more different classification subsystems comprises a decision tree, and wherein the DUT parameters are inputs to the decision tree. In certain other embodiments, wherein one of the two or more different classification subsystems comprises a neural network, and wherein the DUT parameters are inputs to the neural network.

In an embodiment, the method further comprises transmitting, by the inference engine, the test socket status to a test execution subsystem. In an embodiment, generating an alert signal comprises sending an email message, sending a text message, or sending both an email message and a text message. In an embodiment, generating the alert signal comprises halting operation of the handler system.

Additionally, a system is disclosed for detecting whether a device under test (DUT) is stuck in a test socket. The system comprises a handler system, an input queue, disposed within reach of the handler system, a test socket disposed within reach of the handler system and coupled to a test execution subsystem and a real time sampling subsystem, a component pass bin, disposed within reach of the handler system, a component fail bin, disposed within reach of the handler system, an inference engine trained to classify a test socket status, a processor circuit coupled to a non-transitory computer readable medium comprising computer executable instructions. The computer executable instructions, when executed by the processor circuit, instruct the processor circuit to cause the handler system to pick a device under test (DUT) from the input queue, cause the handler system to place the DUT in the test socket, cause the test execution subsystem to apply stimulus signals to the DUT according to a test program for the DUT, cause the real time sampling subsystem to record DUT parameters associated with the DUT responding to the stimulus signals, cause the inference engine to generate a test socket status of either stuck or normal by classifying the DUT parameters, and, upon determining that the test socket status is stuck, generate an alert signal. In an embodiment, at least one DUT parameter comprises a digital representation of an electrical signal generated by the DUT.

In an embodiment, the alert signal causes the handler system to halt. In an embodiment, the computer executable instructions further instruct the processor circuit to cause the handler system to dispose the DUT according to a result from the test program. In an embodiment, the inference engine comprises a gradient boosted decision tree including nodes and functions associated with the nodes, the DUT parameters comprising inputs to the functions, and the test socket status is determined by traversing the tree to reach an assessment. In an embodiment, the inference engine comprises a neural network including input nodes, hidden nodes, and at least one output node, and the DUT parameters are inputs to the input nodes, and the test socket status is generated as a function of the at least one output node.

Furthermore, a non-transitory computer readable medium is disclosed for detecting whether a device under test (DUT) is stuck in a test socket. The non-transitory computer readable medium comprises computer executable instructions that, when executed by a processor circuit, instruct the processor circuit to cause a handler system to pick a device under test (DUT) from an input queue, cause the handler system to place the DUT in a test socket, cause the test execution subsystem to apply stimulus signals to the DUT according to a test program for the DUT, cause the real time sampling subsystem to record DUT parameters associated with the DUT responding to the stimulus signals, cause the inference engine to generate a test socket status of either stuck or normal by classifying the DUT parameters, and, upon determining that the test socket status is stuck, generate an alert signal. In an embodiment, at least one DUT parameter comprises a digital representation of an electrical signal generated by the DUT.

BRIEF DESCRIPTION OF DRAWINGS

Figure (or FIG. 1 illustrates a flow diagram of a method for determining whether a component is stuck in a test socket, in accordance with an embodiment.

DETAILED DESCRIPTION

An automated test system includes a test execution subsystem configured to perform a test program. Executing the test program includes generating and transmitting stimulus signals (e.g., electrical signals) to a component device under test (DUT) as specified in the test program, and determining whether a DUT has passed or failed by comparing sampled response signals to expected values specified in the test program. In an embodiment, electrical response signals generated by the DUT during test program execution are sampled to generate the sampled response signals. The sampled response signals are captured by a real time sampling subsystem and may comprise an arbitrary number of digital vectors, analog voltage values and/or analog current values sampled and digitized as digital DUT parameters, other measured or computed DUT parameters, or any combination thereof. In this way, each DUT has an associated set of DUT parameters. The test program is typically developed to test a specific device design, which may be identified by a particular part number or component identifier. The test socket may be configured according to a specific package and pinout associated with the device design.

During normal operation, a handler system positions the DUT in the test socket. The test program then causes the test execution subsystem to test the DUT. Complete execution of the test program on a given DUT is referred to herein as a test cycle. If the test program determines that the DUT passes, then the handler system moves the DUT from the test socket to a pass bin. If the DUT fails the test program, then the handler system moves the DUT from the test socket to a fail bin.

The handler system is conventionally unable to determine whether the DUT has been successfully moved from the test socket to an appropriate pass/fail bin; however, examining DUT parameters may provide a sufficient signal to determine whether the DUT is stuck in the test socket. In an embodiment, DUT parameters from sequential test cycles are analyzed by a trained inference engine to determine a test socket status as being either "stuck" or "normal" (not stuck).

In an embodiment, the DUT comprises an integrated circuit die packaged within a chip-scale package (CSP). In another embodiment, the DUT comprises at least one integrated circuit die packed within an integrated fan-out (InFO) package. In other embodiments, the DUT may comprise different electrical components including any mix of active and/or passive components, multi-chip modules, or combinations thereof.

Figure 1:
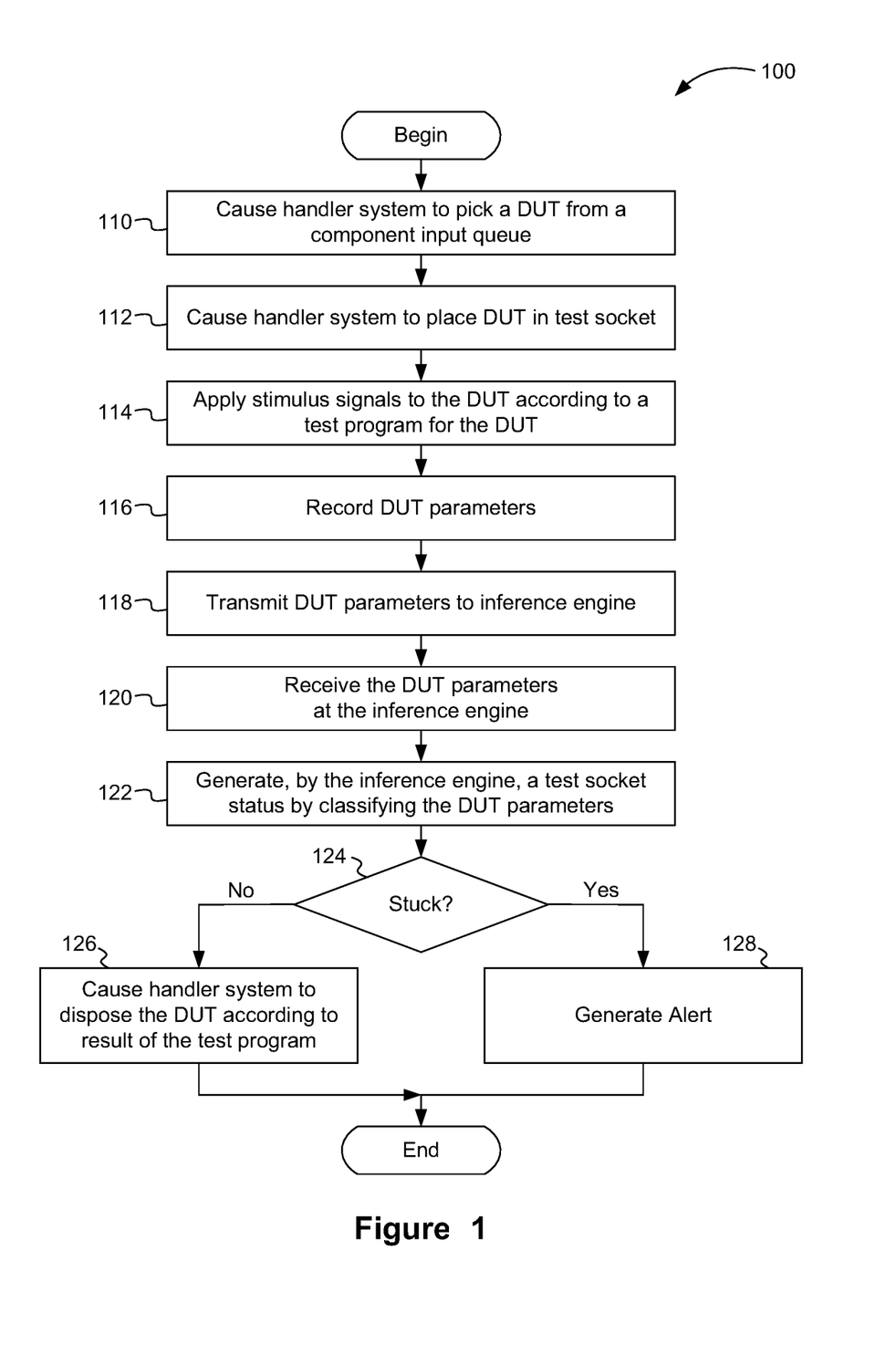

Figure (or FIG. 1 illustrates a flow diagram of a method 100 for determining whether a component is stuck in a test socket, in accordance with an embodiment. Although method 100 is described in conjunction with the systems and figures disclosed herein, persons of ordinary skill in the art will understand that any system that performs method 100 is within the scope and spirit of various embodiments of the present disclosure. In an embodiment, method 100 is performed by an automated test system (e.g., automated test system 200 of FIG. 2A).

Method 100 begins at step 110, where the automated test system causes a handler system to pick up a DUT from an input queue. In an embodiment, the input queue may include untested components, components queued for retesting, or a combination thereof. At step 112, the automated test system causes the handler to place the DUT in the test socket. Any technically feasible technique may be performed to place the DUT in the test socket.

At step 114, the automated test system applies stimulus signals to the DUT according to a test program for the DUT. Each stimulus signal may comprise a programmatically determined sequence of electrical states (e.g., voltages, currents, etc.) specified in the test program, such sequence being fixed or dynamic according to specific DUT testing requirements. In an embodiment, the stimulus signals are generated by a test execution subsystem (e.g., test execution subsystem 230) executing the test program (e.g., test program 232) and applied through the test socket (e.g., test socket 216). A given stimulus signal may represent a binary digital value in the form of a voltage or current level; a stimulus signal may also represent an analog voltage or current value generated by a digital to analog converter. Yet another stimulus signal may include a periodic digital clock signal, an analog waveform, and so forth. More generally, a given stimulus signal may be generated according to particular testing needs of a specific DUT design.

At step 116, the automated test system records a plurality of DUT parameters. The DUT parameters may comprise sampled response signals, generated by sampling signals associated with the DUT responding to the stimulus signals.

In this context, recording includes sampling and digitizing analog response signals into corresponding digital signals, performing analog conditioning on the analog response signals and/or performing digital signal processing on the digitized digital signals. One goal of analog conditioning and/or digital signal processing is to extract a more accurate or representative signal from an original signal that may be subjected to noise or distortion. In addition to recording the DUT parameters, the automated test system may use various DUT parameters as inputs to the test program to determine whether the DUT has passed or failed testing.

At step 118, the automated test system transmits the recorded DUT parameters to an inference engine (e.g., inference engine 250). In an embodiment, the recorded DUT parameters are transmitted over a data network, such as an Ethernet data network. In such an embodiment, the DUT parameters are recorded by a first processing system (e.g., the test execution subsystem) and transmitted through the data network to a different processing system comprising the inference engine. In another embodiment, the recorded DUT parameters are transmitted through a shared buffer. In such an embodiment, the DUT parameters are recorded by a first process executing on a processing system and transmitted through the shared buffer to a second process comprising the inference engine also executing on the processing system. Furthermore, the shared buffer may comprise a shared memory space (e.g., segment), a file within a file system, an inter-process communications buffer, or any other technically feasible inter-process communication construct.

At step 120, the DUT parameters are received at the inference engine. The DUT parameters may be received according to any technically feasible technique. In an embodiment, the DUT parameters are received through a data network. In another embodiment, the DUT parameters are received through a file, a shared memory space, or a shared buffer.

At step 122, the inference engine generates a test socket status by classifying the DUT parameters. In an embodiment, the classification engine receives, as input, DUT parameters from one or more test cycles. In certain embodiments, the classification engine receives, as input, DUT parameters from two or more test cycles. In an embodiment, the inference engine classifies the input DUT parameters to generate a classification of stuck or normal for the test socket status. The inference engine may classify the test socket status as being in a stuck state when there are sufficient indicators or signals within the DUT parameters to conclude that a device is physically stuck within the test socket. Otherwise, the test socket status is assigned a state of normal.

At step 124, if the classification engine determines that the test socket status is stuck, then the method 100 proceeds to step 128. At step 128, the automated test system generates an alert signal. In an embodiment, generating the alert signal comprises halting operation of the handler system and may include sending an email and/or text message to a designated list of recipients. The recipients should include a system operator who is responsible for maintaining operational integrity of the automated test system and can manually clear the stuck device from the test socket. In an embodiment, generating the alert signal comprises producing a visible alarm (e.g., flashing light) or an audio alarm (e.g., a tone, a siren, a bell, a vocalized indication) to indicate to a system operator that the automated test system requires attention. The method then terminates. More generally, generating the alert signal comprises halting overall operation of the automated test system.

Returning to step 124, if the classification engine determines that the test socket status is not stuck (i.e., normal) then the method 100 proceeds to step 126, where the automated test system causes the handler system to dispose the DUT according to results of the test program. A passing DUT is disposed in a pass bin, while a failing DUT is disposed in a fail bin. The method 100 then terminates.

Method 100 may be repeated for each sequential test cycle as each new DUT is retrieved from the input queue. DUT parameters may be stored over multiple sequential test cycles and provided to the inference engine for processing with respect to a current DUT.

Furthermore, in automated test systems that perform testing on multiple devices concurrently, the method 100 may be performed concurrently with the inference engine separately classifying each different set of DUT parameters and separately determining a test socket status for each different concurrently operating test socket.

Figure 2A:
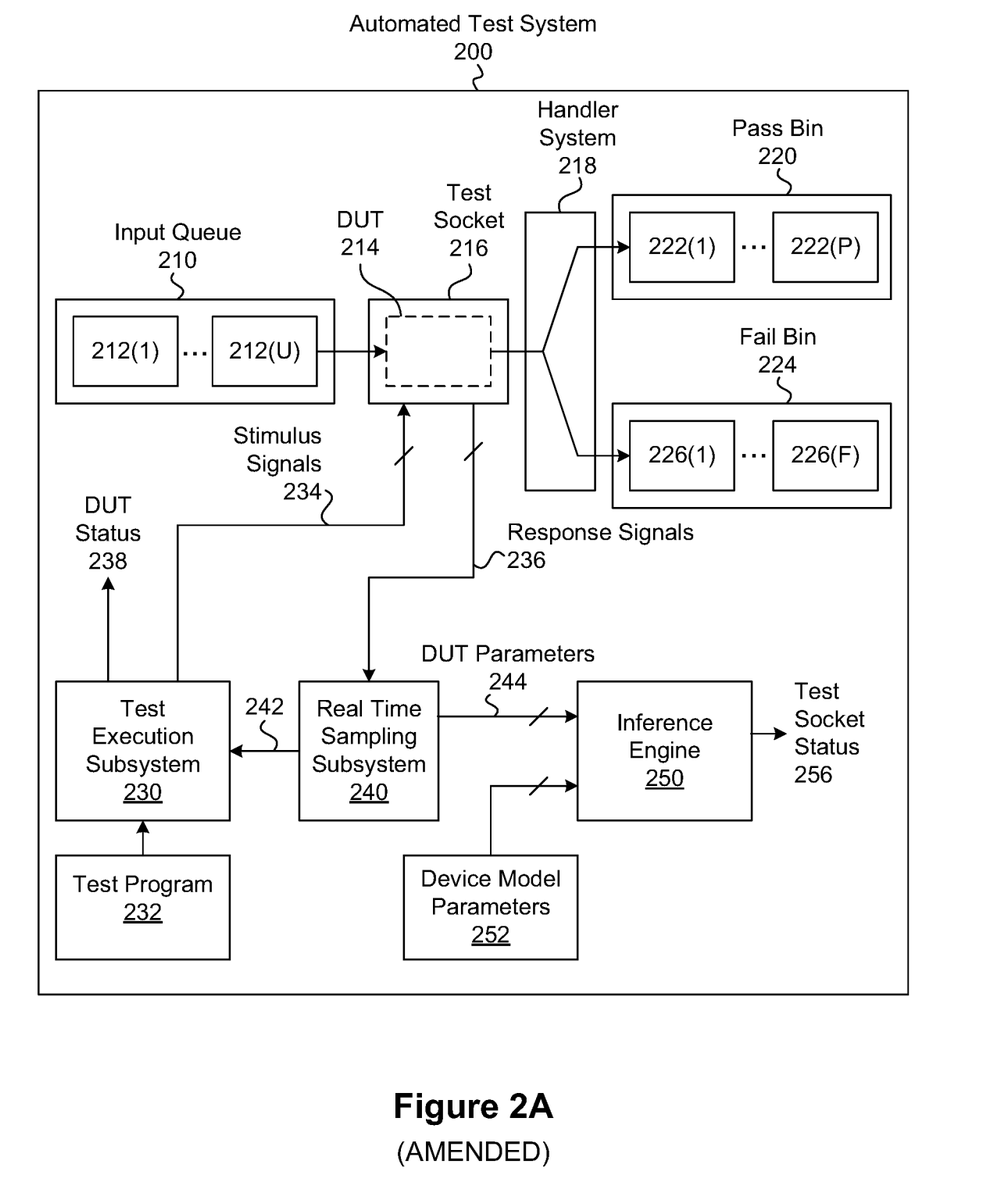
FIG. 2A illustrates an automated test system, in accordance with an embodiment.

FIG. 2A illustrates an automated test system 200, in accordance with an embodiment. As shown, the automated test system 200 includes an input queue 210, a test socket 216, a pass bin 220, a fail bin 224, a test execution subsystem 230, and a real time sampling subsystem 240. During normal operation, a handler system 218, picks an untested device 212 from the input queue 210 and places the untested device 212 in position to be tested within the test socket 216. During testing in the test socket 216, the untested device 212 is designated as a DUT 214. During testing, the test execution subsystem 230 generates stimulus signals 234 according to a test program 232. The test program 232 contains instructions that are designed to test whether the DUT 214 is functioning according to design and specification of the DUT 214. In general, the test program 232 may be very specific to a particular device design (e.g., manufacturer part number) of DUT 214. In response to the stimulus signals 234, the DUT 214 generates response signals 236. A real time sampling subsystem 240 samples and digitizes the response signals 236 and generates corresponding digital representations comprising a set of sampled response signals 242. The sampled response signals 242 may comprise an arbitrary number of digital vectors, digitized analog voltage values and/or analog current values, other measured or computed parameters (e.g., temperature, frequency, etc.), or any combination thereof.

In an embodiment, the test execution subsystem 230 generates a DUT status 238 that indicates whether the DUT 214 passed or failed testing, as specified by the test program 232. The DUT status 238 may comprise a passing/failing state indication within a data structure, a state value for a register/variable, a physical signal state, a payload within a data packet, or any other technically feasible representation of a test result for the DUT 214. The handler system then picks the DUT 214 from the test socket 216 and places the DUT 214 in the pass bin 220 with other passing devices 222 if the DUT test status 238 indicates a pass or the fail bin 224 with other failing devices 226 if the DUT test status 238 indicates a fail.

In certain embodiments, the DUT status 238 further indicates a passing performance level for the DUT 214. For example, the DUT 214 may pass the test program 232 at a lower operating frequency but fail at a higher operating frequency. In such embodiments, the automated test system 200 may include multiple pass bins (not shown) to accommodate holding passing components in separate bins, according to respective performance levels.

In various embodiments, the test execution subsystem 230 receives and compares the sampled response signals 242 to expected values specified in the test program 232. A mismatch between expected digital values or vectors specified in the test program 232 and the sampled response signals 242 may result the DUT 214 failing (i.e., DUT status 238 indicates a fail). Furthermore, a digitized analog signal represented as a digital value in the sampled response signals 242 that exceeds specified bounds (e.g., too high or two low) may also result in the DUT 214 failing. In certain embodiments, one or more signals from the sampled response signals 242 may indicate passing performance (e.g., measured frequency of an on-chip ring oscillator), while in other embodiments, the test execution subsystem 230 may perform testing using different parameters (e.g., externally applied clock frequency) to determine passing performance of the DUT 214.

In an embodiment, one or more of the sampled response signals 242 are selected as DUT parameters 244. The inference engine 250 receives the DUT parameters 244 sampled for the current DUT 214. In some embodiments, inference engine 250 also receives DUT parameters 244 sampled for one or more previous DUTs 214. Prior to processing a first DUT 214, the inference engine 250 receives device model parameters 252 generated for the DUT design. In an embodiment, the device model parameters 252 include model training parameters that specify the operation of one or more corresponding inference structures implemented within the inference engine 250. During the course of each test cycle, the inference engine 250 determines whether the DUT 214 is stuck in the test socket 216, based on the DUT parameters 244. If the DUT 214 is determined to be stuck in the test socket 216, then a test socket status 256 is assigned a status of stuck, otherwise the test socket status 256 is assigned a status of normal. In various embodiments, the automated test system 200 halts testing operations and generates one or more alarms when the test socket status 256 indicates a DUT 214 is stuck.

In an embodiment, the inference engine 250 transmits the test socket status 256 to the test execution subsystem 230. The test socket status 256 may be transmitted through a data network, such as an Ethernet data network. In such an embodiment, the test socket status 256 may be represented as a payload message within a data frame or data packet that is transmitted to the test execution subsystem 230. In another embodiment, the test socket status 256 may be transmitted through a shared buffer or shared file with the test execution subsystem 230. In response to the test socket status 256 indicating a stuck status, the test execution subsystem 230 may cause an alert signal to be generated.

In an embodiment, the test execution subsystem 230 comprises a first processor circuit coupled to a first non-transitory memory circuit. The first non-transitory memory circuit may include instructions that cause the first processor circuit to perform the method 100 of FIG. 1, and/or additional methods and techniques disclosed herein. Additionally, the inference engine 250 may include a second processor circuit coupled to a second non-transitory memory circuit. The second non-transitory memory circuit may include instructions that cause the second processor circuit to perform inference operations, as described herein.

Figure 2B:
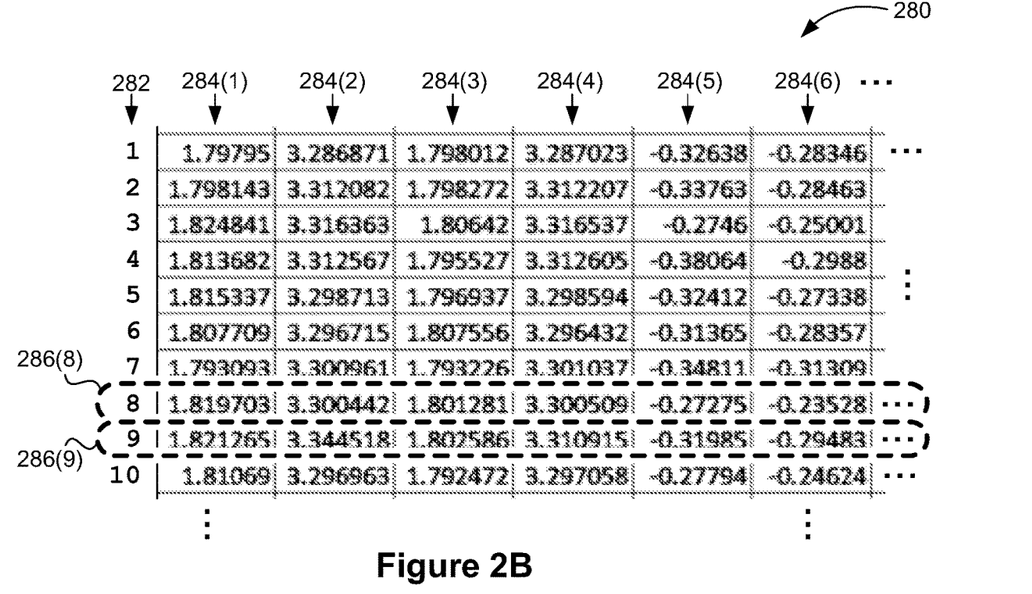
FIG. 2B illustrates exemplary device under test parameters for sequentially tested devices, in accordance with an embodiment.

FIG. 2B illustrates exemplary DUT parameters 280 for sequentially tested devices, in accordance with an embodiment. The sequentially tested devices may be assigned sequential DUT numbers 282. In the present example, a first tested DUT 214 may be assigned a DUT number 282 of one, while a tenth tested DUT 214 may be assigned a DUT number 282 of ten. Certain DUT parameters 244 may be identified for use by the inference engine 250. Such DUT parameters 284 are shown in columns, and a time series taken over multiple DUTs 214 may include columns of DUT parameters 284 spanning DUT numbers 282 for the multiple DUTs 214. For example, a voltage measurement specified by the test program 232 to be performed on a specific output of a DUT 214 may be recorded as a DUT parameter 284.

A row 286 comprises DUT parameters 284 recorded for a corresponding DUT 214. For example, row 286(8) comprises DUT parameters 284 for an eighth DUT 214 tested, while row 286(9) comprises DUT parameters 284 for a ninth DUT 214 tested. During each test cycle, DUT parameters 244 may include one or more rows 286 of DUT parameters 284. In an embodiment, a row 286 represents all sampled response signals 242 selected to be among DUT parameters 244 for a given DUT 214. In certain embodiments, DUT parameters 244 may include more than one row 286.

Figure 2C:
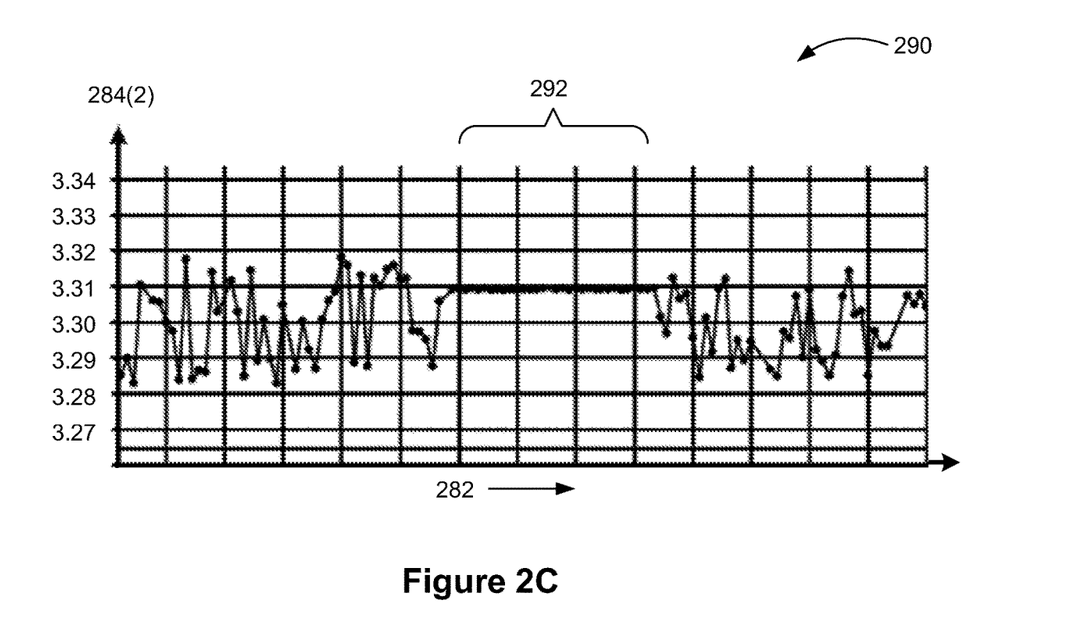
FIG. 2C illustrates an exemplary test parameter measured over different test cycles, in accordance with an embodiment.

FIG. 2C illustrates an exemplary test parameter measured over different test cycles, in accordance with an embodiment. The different test cycles are intended to test different DUTs 214; however, during time 292, a DUT 214 remains stuck in the test socket 216. A time series graph 290 depicts the exemplary test parameter over multiple test cycles. In the present example, the test parameter is DUT parameter 284(2) of FIG. 2B. As shown, the values of DUT parameter 284(2) remain nearly constant during time 292, indicating a very high likelihood of a DUT 214 being stuck in the test socket 216. While this time series graph 290 strongly indicates a stuck signal, in more general scenarios a stuck signal may be significantly more subtle, with each different DUT parameter 284 exhibiting significantly less part-to-part variance relative to measurement noise. Therefore, in certain embodiments, to reliably detect a stuck signal, more than ten to potentially hundreds of different DUT parameters 284 may be processed by the inference engine 250.

Figure 3A:
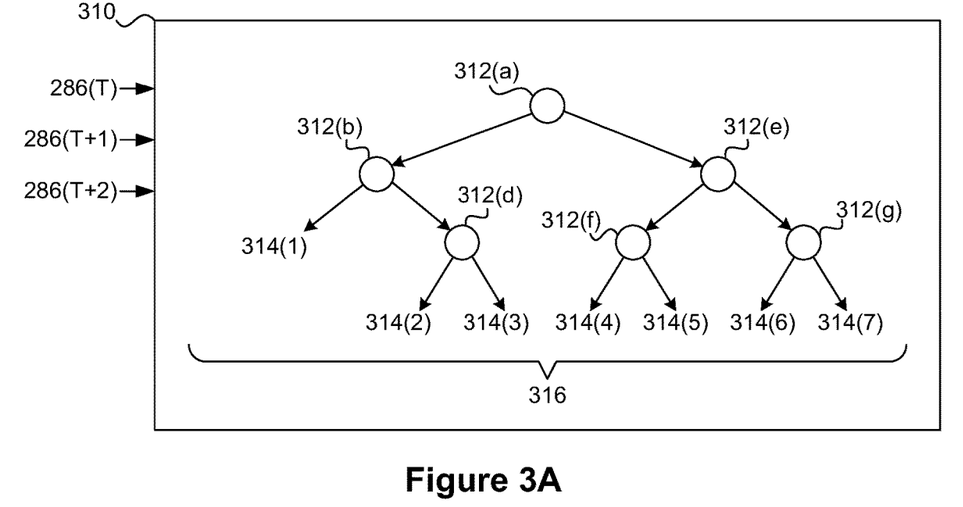
FIG. 3A illustrates a decision tree inference subsystem configured to determine a test socket status, in accordance with an embodiment.

FIG. 3A illustrates a decision tree inference subsystem 310 configured to determine a test socket status 316, in accordance with an embodiment. The inference subsystem 310 may include a tree data object that specifies nodes 312 connected by directional edges. Each node 312 may include a function for determining, based on current input data, whether a left edge or a right edge should be followed during a tree traversal. Each left edge and right edge may terminate at either another node 312 or at an assessment 314 of test socket state. In the context of the present disclosure, a given assessment 314 may be that the test socket 216 is in a stuck state or in a normal state.

The tree may include a root node 312(a) connected to a first child node 312(b) through a left edge and/or a second child node 312(e) through a right edge. In an embodiment, any node 312 may be connected to zero, one, or two child nodes, according to a tree topology specified during a separate learning process. Each function associated with each node may be specified within the tree data object and determined during the learning process. Exemplary functions may include, without limitation, comparison operations (e.g., if a<b, left, else right) to determine whether to follow a left edge or a right edge when traversing the tree.

In an embodiment, the inference subsystem 310 receives one or more rows 286 of DUT parameters 284. The DUT parameters 284 may be specified as input variables to the different functions for corresponding nodes 312, along with coefficients and other details for the different functions during the learning process. The functions and their sequential evaluation priority, specified by the tree structure, collectively define a boundary between stuck and normal operating states for the test socket 216 within a multi-dimensional input variable space. Such a boundary may be complex and require tens to hundreds or more features, with each feature defined by at least one of the functions associated with a corresponding node 312. Furthermore, the boundary may be different for each different device design.

In an embodiment, the functions, related coefficients, and tree structure are learned, optimized, and stored within a tree data object separately for each different device design to be tested by the automated test system 200. Prior to the automated test system 200 testing a batch of devices of a specific device design, the inference engine 250 is configured to assess the stuck or normal state of the devices according to a corresponding tree data object. In an embodiment, configuring the inference engine 250 includes loading the tree data object into a memory system coupled to a processor configured to perform inference operations for the inference engine 250.

During an inference operation, a tree specified by the tree data object is traversed by a runtime system (not shown) to determine an operating state for the test socket 216. Traversing the tree involves selecting root node 312(a) and executing a function associated with root node 312(a) to determine whether to select a left edge leading to node 312(b) or a right edge leading to node 312(e). Similarly, functions associated with sequentially selected nodes 312 are executed and edges followed until an assessment 314 is reached. The test socket status 316 is then assigned either a stuck state or a normal state based on the assigned state of the assessment 314. In an embodiment, the test socket status 316 directly determines the test socket status 256. In another embodiment, the test socket status 316 is one vote of potentially multiple votes from different inference subsystems in an ensemble that determines the test socket status 256.

In an embodiment, the tree data object comprising the decision tree inference subsystem 310 is a decision tree classifier, with at least two classification results of stuck and normal determined based on measured values reflected in the one or more rows 286 of DUT parameters 284. In certain embodiments, the tree data object is a gradient boosted decision tree. The gradient boosted decision tree may be constructed according to any technically feasible technique, including techniques known in the art as gradient boosted learning or gradient boosting. In other embodiments, the tree data object may comprise any technically feasible decision tree construct.

In an embodiment, the device model parameters 252 of FIG. 2A comprise the tree data object, and the inference engine 250 comprises the runtime system for evaluating test socket status 316 based on the tree data object and the one or more rows 286 of DUT parameters 284.

Figure 3B:
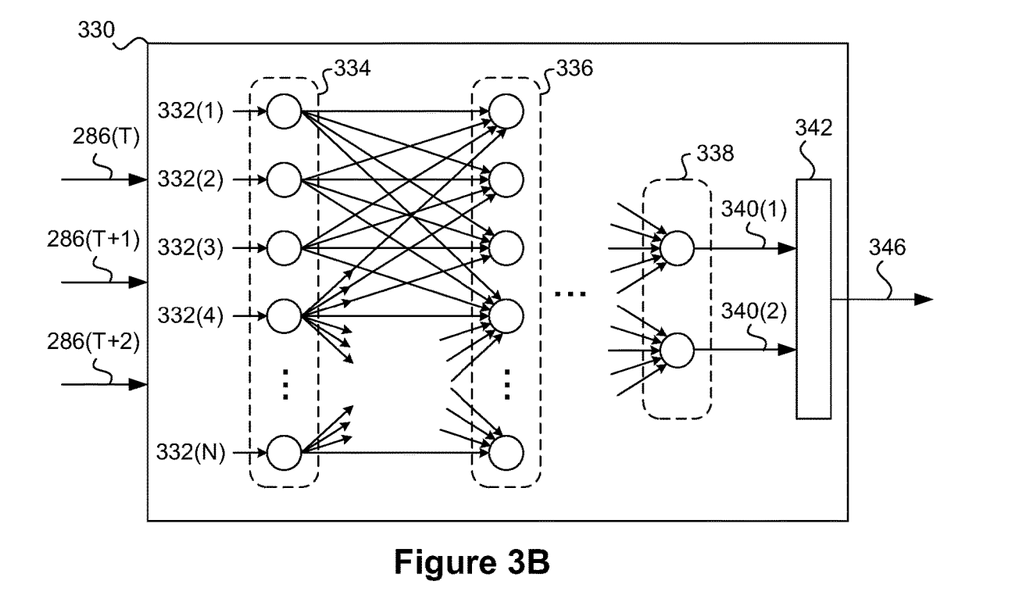
FIG. 3B illustrates a deep neural network inference subsystem configured to determine a test socket status, in accordance with an embodiment.

FIG. 3B illustrates a deep neural network inference subsystem 330 configured to determine a test socket status 346, in accordance with an embodiment. The inference subsystem 330 may include an input layer 334 comprising artificial neuron nodes, each configured to receive a different input 332. In an embodiment, one or more rows 286 of DUT parameters 284 are assigned to different inputs 332. In certain embodiments, numeric values for DUT parameters 284 comprising row 286(T) may be assigned as input values to a first set of inputs 332, and numeric values for DUT parameters 284 comprising row 286(T+1) may be assigned as input values to a different set of inputs 332. Output values from input layer 334 are assigned as input values of a first hidden layer 336. One or more additional hidden layers may be disposed between the first hidden layer 336 and an output layer 338.

In an embodiment, a first output signal 340(1) from the output layer 338 indicates a confidence level that the test socket 216 is in a stuck state, while a second output signal 340(2) indicates a confidence level that the test socket 216 is in a normal state. An output function 342 generates the test socket status 346, based on first output signal 340(1) and/or second output signal 340(2). In an embodiment, the output function 342 generates a test socket status 346 of stuck when the first output signal 340(1) is above a predetermined threshold and is also larger than the second output signal 340(2); otherwise, the output function 342 generates a test socket status 346 of normal. In an alternative embodiment, output function 342 generates a test socket status 346 of stuck when the first output signal 340(1) is above a predefined threshold or a test socket status 346 of normal otherwise. In another alternative embodiment, output function 342 assigns the test socket status 346 to normal when the second output signal 340(2) is above a predefined threshold or a test socket status 346 of stuck otherwise.

In various embodiments, each artificial neuron node within the inference subsystem 330 operates according to a set of configuration coefficients, such as weight and bias coefficients. Furthermore, configuration coefficients for all artificial neurons within the inference subsystem 330 may collectively specify a network configuration for the inference subsystem 330. A given network configuration may be generated by training the inference subsystem 330 to identify stuck and/or normal operating states for a particular device design.

In an embodiment, a network configuration for each different device design to be tested by the automated test system 200 may be trained separately and stored separately. Prior to the automated test system 200 testing a batch of devices of a specific device design, an instance of the inference subsystem 330 comprising the inference engine 250 is configured to assess the stuck or normal state of the devices according to the network configuration trained for the device design. In an embodiment, the network configuration is loaded into a memory system coupled to a processor configured to perform inference operations for the inference subsystem 330.

During an inference operation, a neural network configured according to the network configuration is evaluated by a runtime system (not shown) to determine an operating state for the test socket 216. In an embodiment, the test socket status 346 directly determines the test socket status 256. In another embodiment, the test socket status 346 is one vote of potentially multiple votes from different inference subsystems comprising an ensemble that determines the test socket status 256.

In an embodiment, the device model parameters 252 of FIG. 2A comprise the network configuration, and the inference engine 250 comprises an instance of the inference subsystem 330. Furthermore, the test socket status 246 is evaluated based on the network configuration and the one or more rows 286 of DUT parameters 284.

Figure 3C:
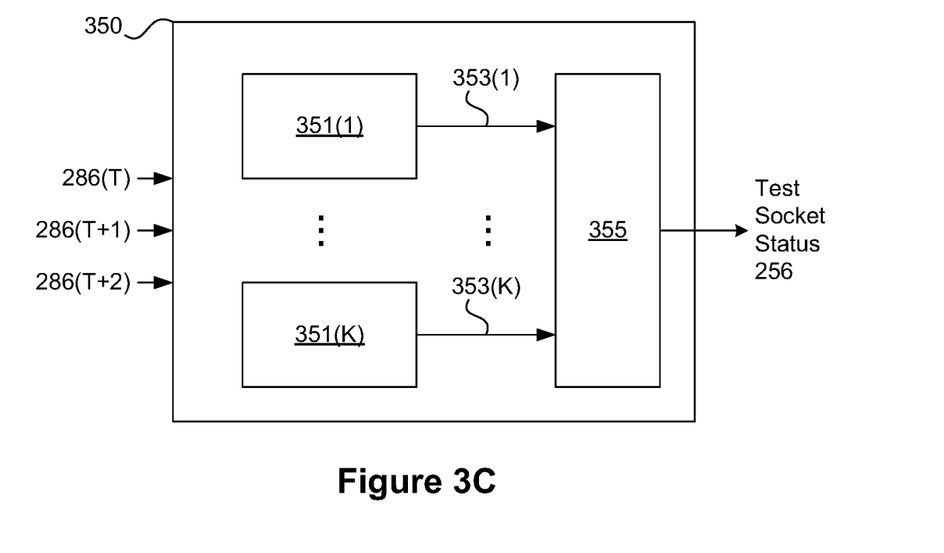
FIG. 3C illustrates an ensemble of different inference subsystems configured to collectively determine a test socket status, in accordance with an embodiment.

FIG. 3C illustrates an ensemble 350 of different inference subsystems 351 configured to collectively determine a test socket status 256, in accordance with an embodiment. In an embodiment, the inference engine 250 of FIG. 2A includes an instance of the ensemble 350, which determines the test socket status 256.

As shown, rows 286 of DUT parameters 284 are provided as input values to the ensemble 350. Inference subsystems 351(1) through 351(K) may receive, as input, any or all of the values from the DUT parameters 284. Furthermore, different inference subsystems 351 may optionally receive different subsets of the values. Each inference subsystem 351 generates a test socket status 353 according to a corresponding inference technique for the inference subsystem 351. In an embodiment, each test socket status 353 comprises a vote for either a normal state or a stuck state.

A decision function 355 combines the different test socket status 353 votes from the different inference subsystems 351 to generate the test socket status 256. In an embodiment, the decision function 355 comprises a majority vote function. In other embodiments, the decision function 355 comprises a weighted vote function with different test socket status 353 results given different weight according a confidence value applied to each test socket status 353.

In an embodiment, two or more inference subsystems 351 comprise boosted decision trees, each trained to identify a stuck test socket state for a particular device design. In such an embodiment, the two or more inference subsystems 351 may comprise corresponding instances of the inference subsystem 310 of FIG. 3A, with each instance having different training to identify a stuck socket state.

In another embodiment, two or more inference subsystems 351 collectively comprise a random forest trained to identify a stuck test socket state for the device design. In such an embodiment, each sub-tree within the random forest may comprise an inference subsystem 351, with each sub-tree trained differently to identify stuck signals. Alternatively, a given inference subsystem 351 may include a complete random forest.

In yet another embodiment, the two or more inference subsystems 351 include deep neural networks trained to identify a stuck test socket state for a given device design. In such an embodiment, the two or more inference subsystems 351 may comprise corresponding instances of the inference subsystem 330 of FIG. 3B, with each instance having different training to identify a stuck socket state.

In an alternative embodiment, the inference subsystems 351 include a combination of a deep neural network, a decision tree, any other technically feasible classifier, or any combination thereof. Furthermore, a given inference subsystem 351 may include any technically feasible classifier without departing from the scope and spirit of various embodiments.

Figure 4:
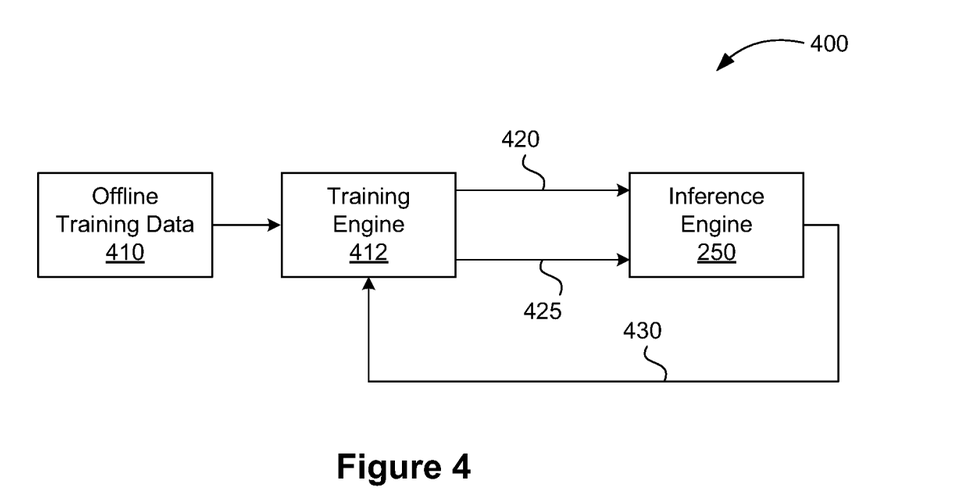
FIG. 4 illustrates a training system for an inference engine, in accordance with an embodiment.

FIG. 4 illustrates a training system 400 for inference engine 250, in accordance with an embodiment. In an embodiment, the training system 400 trains the inference engine 250 to identify a stuck state for a specific device design. Training may be performed by a training engine 412 using offline training data 410 generated for the device design. As shown, offline training data 410 is received by training engine 412. The training engine 412 generates training parameter data 420 from the offline training data 410 and transmits the training parameter data 420 to the inference engine 250. The training engine 412 also generates and transmits device model parameters 425 to the inference engine 250. The device model parameters 425 include configuration information (e.g., a tree data object, a network configuration) that specifies the operation of a classifier or an ensemble comprising the inference engine 250.

In an embodiment, the offline training data 410 includes rows of sampled response signals 242, with each row corresponding to sampled response signals 242 for one DUT 214. For training purposes, each row may include a label indicating a stuck state or a normal state.

During training, the training engine 412 challenges the inference engine 250 to classify the training parameter data 420. The training engine 412 then adjusts the device model parameters 425 based on a classification result 430 to more accurately match labels (stuck or normal) in the offline training data 410. Any technically feasible training techniques may be performed as appropriate to the structure(s) of the inference engine 250 without departing from the scope and spirit of various embodiments. Upon completing training for the inference engine 250 by the training engine 412, the device model parameters 425 may be stored as device model parameters 252.

In an embodiment, the offline training data 410 may be obtained during execution of a test program (e.g., test program 232) on physical samples of a specific device design, with sampled response signals 242 being recorded; alternatively, offline training data 410 may be obtained from a random variate generator configured to produce sets of representative DUT parameters (e.g., conforming to distribution properties of the DUT parameters 284). The training engine 412 may preprocess the offline training data 410 to remove outlier samples, rescale DUT parameters 284 through min-max normalization, and perform feature selection to identify which DUT parameter variations and/or best distinguish between different device instances. In an embodiment, DUT parameters 244 comprise a subset of the sampled response signals 242, and feature selection comprises selecting a subset of the DUT parameters 244 to serve as DUT parameters 284. The DUT parameters 284 are processed during production operation of the inference engine 250, while DUT parameters 244 may be processed during feature selection procedures involving the inference engine 250. Any technically feasible feature selection technique(s), including automatic techniques known in the art, may be implemented to perform feature selection.

Training may proceed using unsupervised learning techniques and/or supervised learning techniques. In an unsupervised learning embodiment, labels are applied to the offline training data 410 according to clustering within different variable spaces defined by different sets of DUT parameters. In such an embodiment, a K-means (or similar) clustering algorithm may aggregate different sets of DUT parameters into K clusters. In an exemplary implementation, K>2 clusters are used to represent only 2 possible states (stuck and normal) for the test socket 216, thereby allowing greater flexibility in clustering to accommodate more complicated decision boundaries. Clusters in {0, 1, 2, . . . K−1} are then assigned stuck or normal labels. A stuck status for the test socket may be detected as a fixed pattern, while a non-stuck status may be indicated by varying patterns. In such an embodiment, rows may be labeled automatically according to an associated cluster label. A supervised learning implementation may include explicitly labeling rows as representing stuck or normal state for the test socket 216. Such explicit labeling may be performed manually or automatically according to an associated cluster label, as described herein.

It is noted that the techniques described herein are embodied in executable instructions stored in a non-transitory computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such flash memory, random access memory (RAM), read-only memory (ROM), and the like.

As used here, a "non-transitory computer-readable medium" includes one or more of any suitable media for storing the executable instructions of a computer program such that the instruction execution machine, system, apparatus, or device may read (or fetch) the instructions from the non-transitory computer readable medium and execute the instructions for carrying out the described methods. Suitable storage formats include one or more of an electronic, magnetic, optical, and electromagnetic format.

It should be understood that the arrangement of components illustrated in the Figures described are exemplary and that other arrangements are possible. It should also be understood that the various system components defined by the claims, described below, and illustrated in the various block diagrams represent logical components in some systems configured according to the subject matter disclosed herein.

For example, one or more of these system components may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

It will be recognized that the various actions, functions, and methods disclosed herein may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein included the one or more modes known to the inventors for carrying out the claimed subject matter. Of course, variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A method, comprising:
   causing a handler system to pick a device under test (DUT) from an input queue;
   causing the handler system to place the DUT in a test socket;
   applying stimulus signals to the DUT according to a test program for the DUT;
   recording DUT parameters associated with the DUT responding to the stimulus signals;
   generating, by an inference engine, a test socket status of either stuck or normal by classifying the DUT parameters; and
   upon determining that the test socket status is stuck, generating an alert signal,
   wherein at least one DUT parameter comprises a digital representation of an electrical signal generated by the DUT, and
   wherein the electrical signal is an analog voltage or an analog current.

2. The method of claim 1, further comprising, upon determining that the test socket status is normal, causing the handler system to dispose the DUT according to a test program result.

3. The method of claim 2, wherein the test program result is passing and the handler system disposes the DUT in a pass bin.

4. The method of claim 1, wherein the DUT comprises an integrated circuit die packaged within a chip scale package or at least one integrated circuit packaged within an integrated fan-out package.

5. The method of claim 1, wherein the inference engine comprises a decision tree including nodes and functions associated with the nodes, the DUT parameters comprising inputs to the functions, and wherein the test socket status is determined by traversing the tree to reach an assessment.

6. The method of claim 5, wherein the decision tree comprises a gradient boosted decision tree.

7. The method of claim 1, wherein the inference engine comprises a neural network including input nodes, hidden nodes, and at least one output node, and wherein the DUT parameters are inputs to the input nodes, and the test socket status is generated as a function of the at least one output node.

8. The method of claim 1, wherein the inference engine comprises an ensemble of two or more different classification subsystems and the test socket status is generated by combining outputs from the two or more different classification subsystems.

9. The method of claim 8, wherein one of the two or more different classification subsystems comprises a decision tree, and wherein the DUT parameters are inputs to the decision tree.

10. The method of claim 8, wherein one of the two or more different classification subsystems comprises a neural network, and wherein the DUT parameters are inputs to the neural network.

11. The method of claim 1, further comprising transmitting, by the inference engine, the test socket status to a test execution subsystem.

12. The method of claim 1, wherein generating an alert signal comprises sending an email message, sending a text message, or sending both an email message and a text message.

13. The method of claim 1, wherein generating the alert signal comprises halting operation of the handler system.

14. A system, comprising
a handler system;
an input queue;
a test socket coupled to a test execution subsystem and a real time sampling subsystem;
a component pass bin connected to the handler system;
a component fail bin connected to the handler system;
an inference engine trained to classify a test socket status;
a processor circuit coupled to the inference engine and a non-transitory computer readable medium comprising computer executable instructions that, when executed by the processor circuit, instruct the processor circuit to:
cause the handler system to pick a device under test (DUT) from the input queue;
cause the handler system to place the DUT in the test socket;
cause the test execution subsystem to apply stimulus signals to the DUT according to a test program for the DUT;
cause the real time sampling subsystem to record DUT parameters associated with the DUT responding to the stimulus signals;
cause the inference engine to generate a test socket status of either stuck or normal by classifying the DUT parameters; and
upon determining that the test socket status is stuck, generate an alert signal,
wherein at least one DUT parameter comprises a digital representation of an electrical signal generated by the DUT, and
wherein the electrical signal is an analog voltage or an analog current.

15. The system of claim 14, wherein the alert signal causes the handler system to halt.

16. The system of claim 14, wherein the computer executable instructions further instruct the processor circuit to cause the handler system to dispose the DUT according to a result from the test program.

17. The system of claim 14, wherein the inference engine comprises a gradient boosted decision tree including nodes and functions associated with the nodes, the DUT parameters comprising inputs to the functions, and wherein the test socket status is determined by traversing the tree to reach an assessment.

18. The system of claim 14, wherein the inference engine comprises a neural network including input nodes, hidden nodes, and at least one output node, and wherein the DUT parameters are inputs to the input nodes, and the test socket status is generated as a function of the at least one output node.

19. A non-transitory computer readable medium comprising computer executable instructions that, when executed by a processor circuit, instruct the processor circuit to:
cause a handler system to pick a device under test (DUT) from an input queue;
cause the handler system to place the DUT in a test socket;
cause the test execution subsystem to apply stimulus signals to the DUT according to a test program for the DUT;
cause the real time sampling subsystem to record DUT parameters associated with the DUT responding to the stimulus signals;
cause the inference engine to generate a test socket status of either stuck or normal by classifying the DUT parameters; and
upon determining that the test socket status is stuck, generate an alert signal,
wherein at least one DUT parameter comprises a digital representation of an electrical signal generated by the DUT, and
wherein the electrical signal is an analog voltage or an analog current.

* * * * *